United States Patent [19]

Emery

[11] Patent Number: 5,897,399

[45] Date of Patent: Apr. 27, 1999

[54] VERSATILE INPUT/OUTPUT CONTROL AND POWER DISTRIBUTION BLOCK FOR USE WITH AUTOMATED TOOLING

[75] Inventor: Keith E. G. Emery, San Diego, Calif.

[73] Assignee: Hewlett-Packard Company, Palo Alto, Calif.

[21] Appl. No.: 08/783,852

[22] Filed: Jan. 16, 1997

[51] Int. Cl.$^6$ .............................. H01R 9/24; H01R 29/00
[52] U.S. Cl. ...................... 439/709; 200/51.04; 439/652; 439/218
[58] Field of Search ............................. 439/52, 709, 716, 439/218, 638, 651, 652; 200/51.02–51.06

[56] References Cited

U.S. PATENT DOCUMENTS

| 4,520,429 | 5/1985 | Hosking | 200/51.04 |
| 4,782,245 | 11/1988 | Henry | 307/147 |
| 4,878,860 | 11/1989 | Matsuoka | 439/502 |
| 5,276,443 | 1/1994 | Gates | 200/51.04 |

OTHER PUBLICATIONS

"Daniel Woodhead 1995–1996 Buyer's Guide", pp. 79, 247–249.

Primary Examiner—Neil Abrams

[57] ABSTRACT

A termination unit includes two termination pucks. A first termination puck (20) includes a plurality of first connectors (21). The first connectors (21) are of a first type. A main connector (22) of the first termination puck (20) is electrically connected to each first connector within the plurality of first connectors (21). A second termination puck (40) includes a first main connector (42) for connection to the main connector (22) of the first termination puck (20). The second termination puck (40) also includes a plurality of second connectors (44–49) that may be formed as wire receptacles. The second connectors (44–49) are of different connector type than the first connectors (21) on the first termination puck (20). Each of a plurality of switches (51–54) on the second termination puck (40) select either a control/status pin from the first main connector (42) or a control/status pin from one of the second connectors (44–49) to be electrically connected to a control/status pin of a second main connector (43). With the two pucks electrically interconnected, tools may be joined by cables to first connectors (21) on the first termination puck (20) or by individual wires to the wire receptacles (44–49) on the second termination puck (40) and switches (51–54) on the second puck may be used to selectively electrically join first connectors (21) or wire receptacles (44–49) to second main connector (43).

8 Claims, 4 Drawing Sheets

VERSATILE INPUT/OUTPUT CONTROL AND POWER DISTRIBUTION BLOCK FOR USE WITH AUTOMATED TOOLING

BACKGROUND

The present invention concerns automated tooling and pertains particularly to a versatile input/output control and power distribution block for use with automated tooling.

When using automated tooling, a programmable logic controller is often required to send output control signals to and receive input sensor signals from several automated tools. Typically the connection to each automated tool consists of three wires: a wire which carries a ground signal, a wire which carries a power signal, and a wire which either carries control/status signal which either forwards a control signal to the automated tool or receives a sensor signal from the automated tool.

The connections from the automated tools are typically terminated at a termination block. At the termination block, the ground signals and the power signals connected to the automated tools are combined. The termination block passes the control signals and the sensor signals between the programmable logic controller and the individual automated tools.

The three individual wires from each automated tool, grouped together in a sensor cable, have been connected to a terminator block using wire leads held in individual wire receptacles. However, when the automation tools are used in production, often this can result in the sensor cables being subject to repetitive motion. Over the course of time, this can result in the wires within the cables becoming permanently or intermittently defective. When wire leads are held in individual wire receptacles, replacement of the sensor cables can be time consuming.

To alleviate this problem, some manufacturers have utilized sensor cables with connectors which can be plugged into a terminator block. This has provided for an easier replacement of defective sensor cables. However, existing units which utilize these types of connectors typically can connect to no more than eight sensor connector cables and are not backward compatible with automated tools which require the use of pull-up/down resistors or which have wires with flying leads.

SUMMARY OF THE INVENTION

In accordance with the preferred embodiment of the present invention, a termination unit for an automated tooling system is presented. The termination unit includes two termination pucks. A first termination puck includes a plurality of first connectors. The first connectors are of a first type. For example, the first connectors are DIN connectors. A main connector within the first termination puck is electrically connected to each first connector within the plurality of first connectors. For example, the main connector of the first termination puck is a 25 pin male D-sub connector.

A second termination puck includes a first main connector for connection to the main connector of the first termination puck. For example, the first main connector is a 25 pin female D-sub connector. The second termination puck includes a plurality of second connectors. The second connectors are of different connector type than the first connectors on the first termination puck. For example, the second connectors are implemented using wire receptacles. A second main connector on the second termination puck is, for example, a 25 pin male D-sub connector. Each of a plurality of switches on the second termination puck select either a control/status pin from the first main connector or a control/status pin from one of the second connectors to be electrically connected to a control/status pin of the second main connector.

The present invention provides for a termination which is configurable to allow for connection of automated tooling to different types of connectors.

DESCRIPTION OF THE PREFERRED EMBODIMENT

Figure 1:
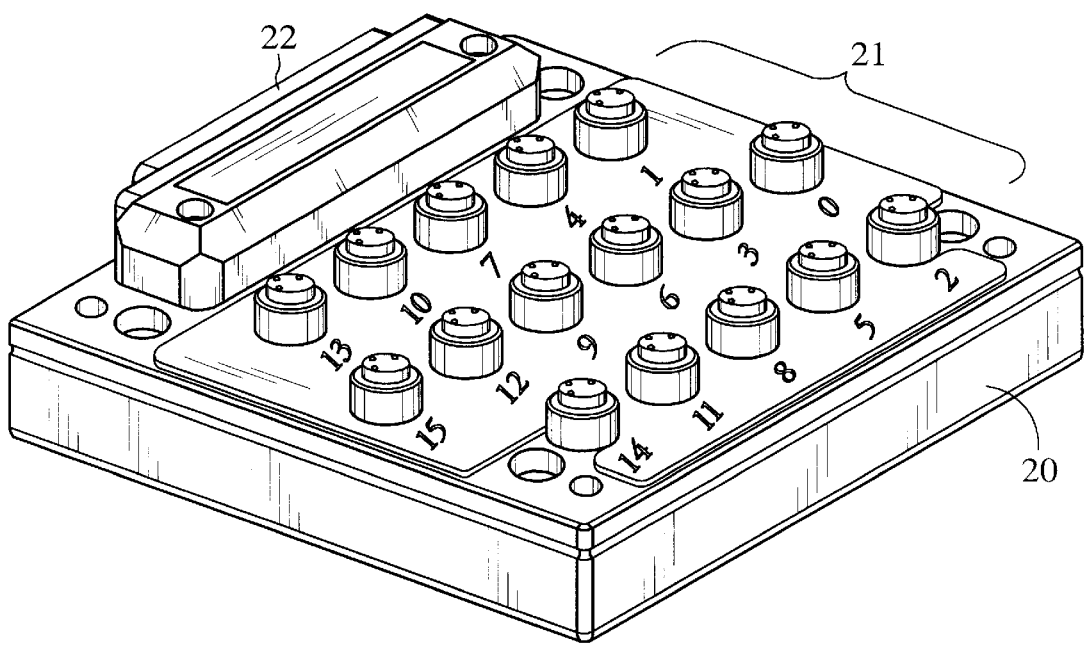
FIG. 1 shows a top view of a pico termination puck in accordance with a preferred embodiment of the present invention.

FIG. 1 shows a top view of a pico termination puck (PTP) 20. PTP 20 functions as an input/output control and power distribution block. PTP 20 includes sixteen termination connectors 21. Each of termination connectors 21 is an 8 millimeter DIN connector.

Pico to pico cord sets are used to connect PTP 20 to automated tools. Eight millimeter pico to pico cord sets are available from a variety of places, for example, from Turk, Inc., having a business of 3000 Campus Drive, Minneapolis, Minn. 55441. These pico sets have a male DIN connector on one end and a female DIN connector on the other end. The pico sets are available in both straight and 90 degree orientations on the sensor end. The pico cords come in various lengths (e.g., 0.3 meters, 0.6 meters, 0.9 meters, 1.2 meters, 1.5 meters and 1.8 meters) which can be plugged together to make custom lengths. There is also available a Pico to Euro 0.5 meter adapter cable for sensors that have a 12 millimeter (Euro connector). For valve termination, type "A" and "B" valve din connector cables are available, both in 0.6 meter and 0.9 meter lengths. In the preferred embodiment, PTP 20 is capable of handling eight amps total, and 500 milliamps per connector.

A main termination connector 22 is a 25 pin male D-sub connector. Main termination connector 22 is used to connect PTP 20 to a programmable logic controller (PLC) via a cable assembly. The cable used in the cable assembly is constructed using a female over-molded D-sub connector which mates to main termination connector 22. On the other end of the cable there is a pre-terminated input/output (I/O) terminal block, which plugs directly into an I/O card. The I/O card plugs into a PLC. For example, the PLC is one available from Allen-Bradley Company, Inc., having a business address of 1201 South Second Street, Milwaukee, Wis. 53204.

Figure 2:
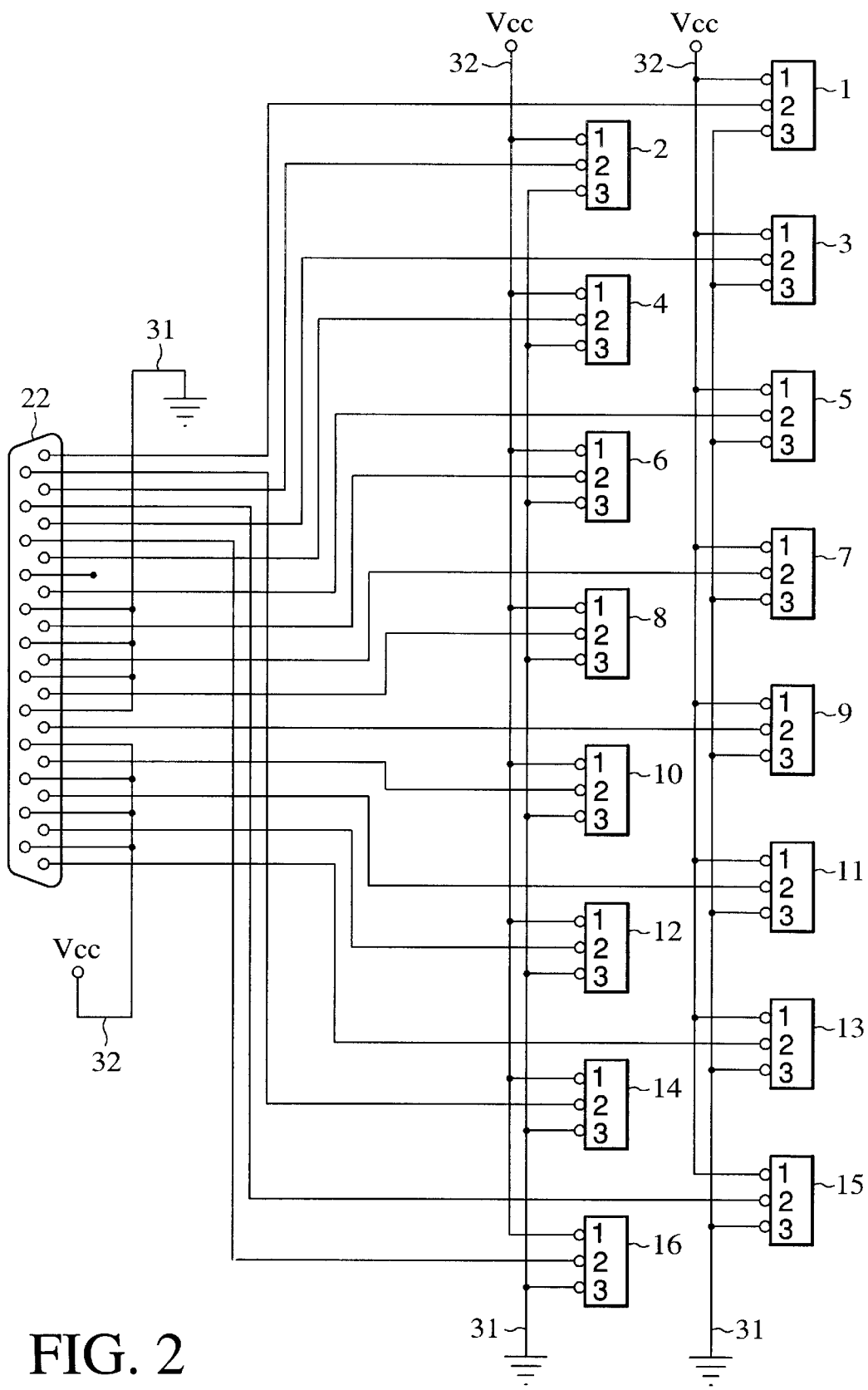
FIG. 2 shows a schematic for the pico termination puck shown in FIG. 1 in accordance with a preferred embodiment of the present invention.

FIG. 2 shows a schematic of PTP 20. Termination connectors 21 are shown in the schematic as a termination connector 1, a termination connector 2, a termination connector 3, a termination connector 4, a termination connector 5, a termination connector 6, a termination connector 7, a termination connector 8, a termination connector 9, a termination connector 10, a termination connector 11, a termination connector 12, a termination connector 13, a termination connector 14, a termination connector 15 and a termination connector 16. Each of termination connectors 1 through 16 includes three pins. A first pin is connected to a power source 32. A second pin is connected to a pin in main termination connector 22. A third pin is connected to a reference voltage (ground) 31.

Figure 3:
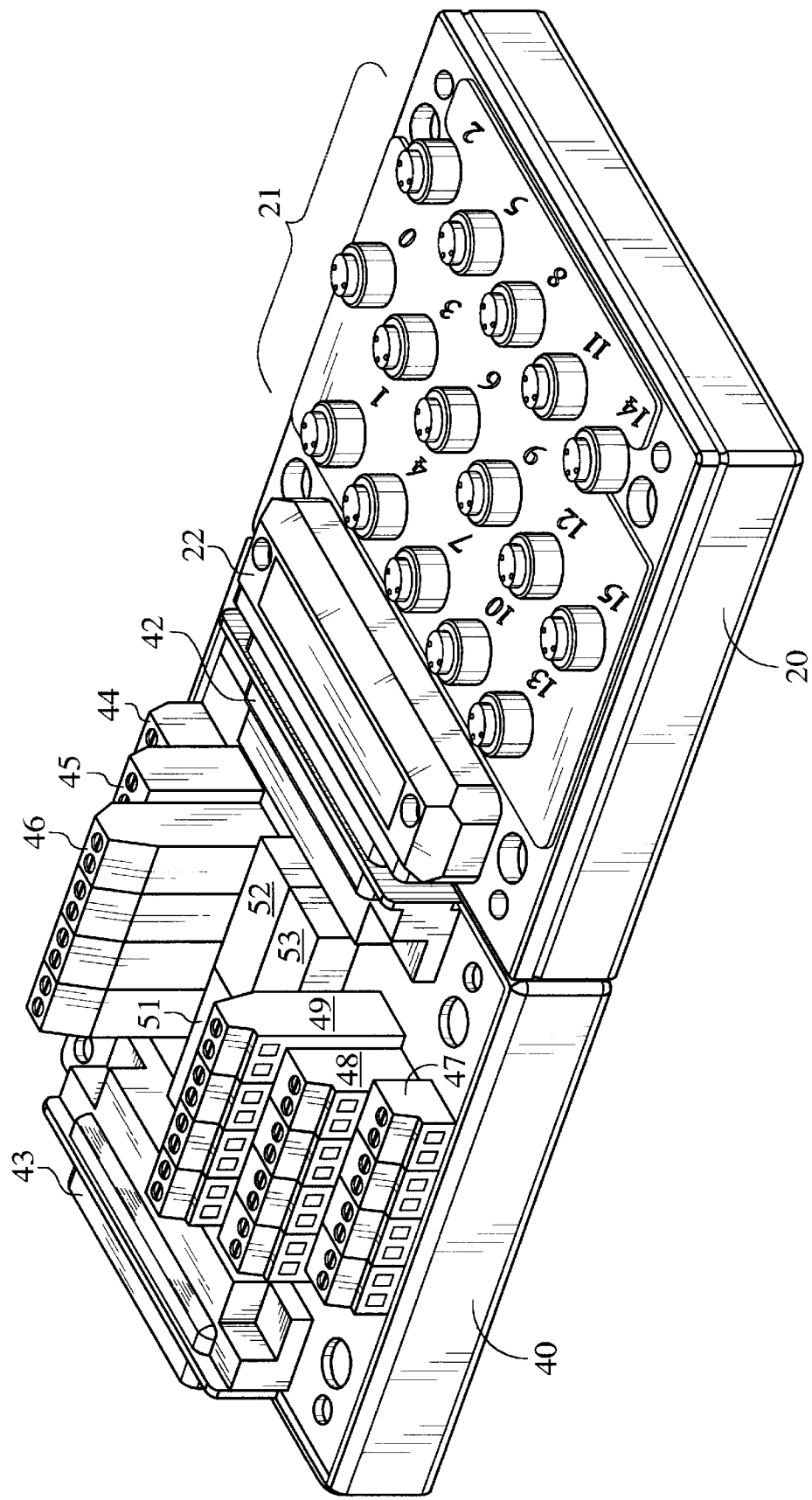
FIG. 3 shows the pico termination puck shown in FIG. 1 connected to a termination block puck in accordance with a preferred embodiment of the present invention.

FIG. 3 shows PTP 20 connected to a termination block puck (TBP) 40. TBP 40 can be utilized when pull-up/down resistors are used or when sensors with flying leads are used. Wire receptacles 44, 45, 46, 47, 48 and 49 are used to receive and secure wire leads to TBP 40. Wire receptacles 44 and 47 receive wire lines to be connected to ground. Wire receptacles 45 and 48 receive wire lines to be connected to power. Wire receptacles 46 and 49 receive wire lines to be connected to control outputs or sensor inputs.

A connector 42 is a 25 pin female D-sub connector, which mates to main termination connector 22. A connector 43 is a 25 pin male D-sub connector which is used to connect TBP 40 to a programmable logic controller (PLC) via a cable assembly. This allows TBP 40 to be connected to PTP 20 and utilized only when necessary. When use of TBP 40 is not required, PTP 20 can be utilized alone. When TBP 40 and PTP 20 are used together, a DIP switch group 51, a DIP switch group 52, a DIP switch group 53 and a DIP switch group 54 (shown in FIG. 4) are used to select for each sensor/control pin whether a sensor cable is connected to PTP 20, or whether wire connection is made to TBP 40.

Figure 4:
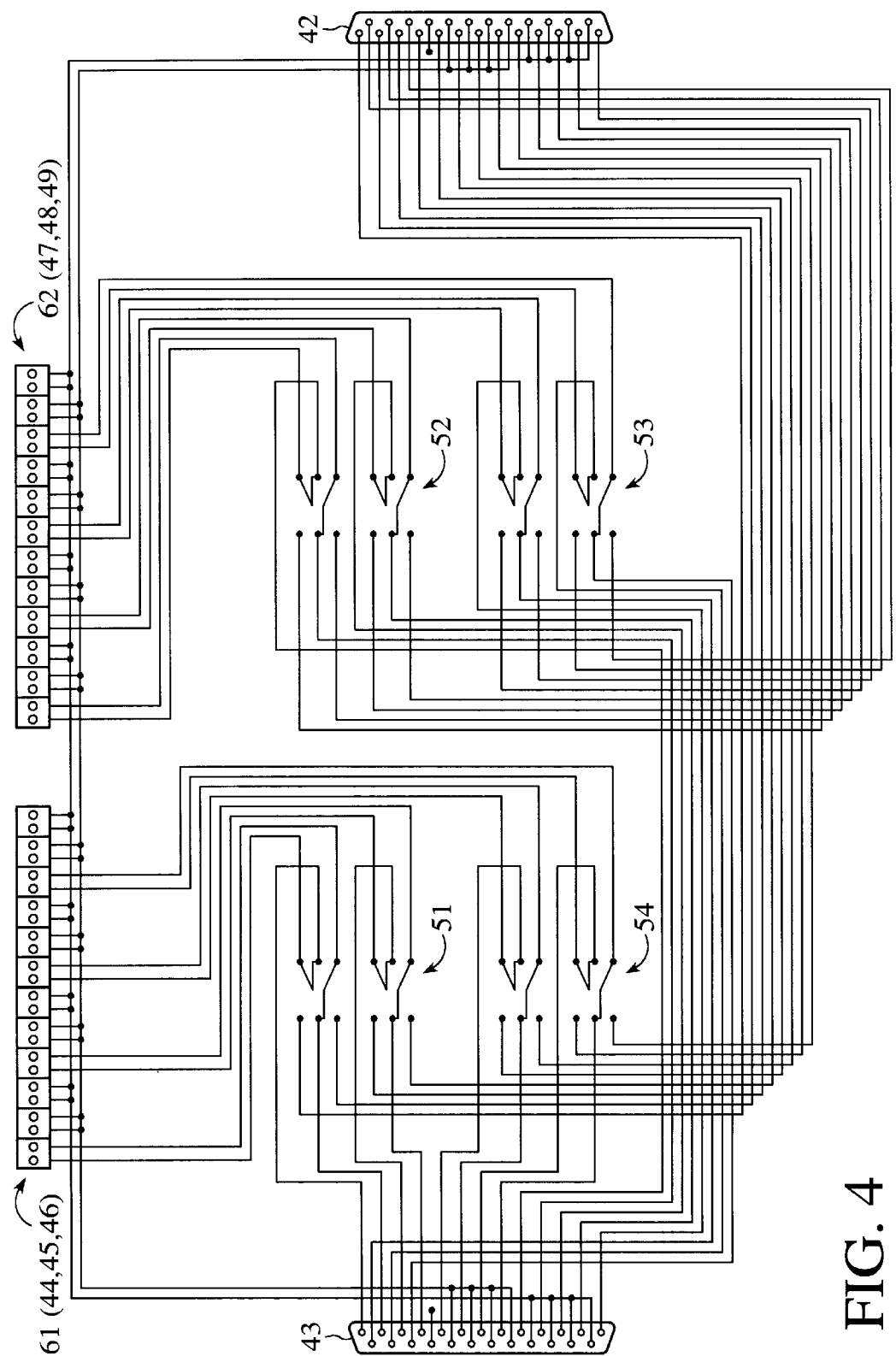
FIG. 4 shows a schematic for the termination block puck shown in FIG. 3 in accordance with a preferred embodiment of the present invention.

FIG. 4 shows a schematic for TBP 40. Wire receptacles 44, 45, 46, 47, 48 and 49, shown in FIG. 3, are shown as schematic connectors 61 and 62 in FIG. 4. DIP switch group 51, DIP switch group 52, DIP switch group 53 and DIP switch group 54 are shown to each contain four DIP switches. Each DIP switch selects either a control/status pin from connectors 61 and 62 or a control/status pin from connector 42 to be connected to a control/status pin of connector 43. When DIP switch selects a control/status pin from connectors 61 and 62 to be connected to a control/status pin of connector 43, the associated automated tool is connected to TBP 40. When DIP switch selects a control/status pin from connector 42 to be connected to a control/status pin of connector 43, the associated automated tool is connected to PTP 20.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

I claim:

1. A termination unit for an automated tooling system comprising:
    a first termination puck, the first termination puck including:
        a plurality of first connectors, the first connectors being of a first type of connector, and
        a main connector, the main connector being electrically connected to each first connector within the plurality of first connectors; and,
    a second termination puck, the second termination puck including:
        a first main connector, the first main connector being electrically connected to the main connector of the first termination puck,
        a plurality of second connectors, the second connectors being of a second type of connector, the second type being different than the first type,
        a second main connector, and
        a plurality of switches each switch for selecting either a control/status pin from the first main connector or a control/status pin from one of the second connectors within the plurality of second connectors to be electrically connected to a control/status pin of the second main connector.

2. A termination unit as in claim 1 wherein the first type of connector is a DIN connector.

3. A termination unit as in claim 1 wherein the second type is a plurality of wire receptacles.

4. A termination unit as in claim 1 wherein:
    the main connector of the first termination puck is a 25 pin male D-sub connector;
    the first main connector is a 25 pin female D-sub connector; and,
    the second main connector is a 25 pin male D-sub connector.

5. A method for termination in an automated tooling system, the method comprising the following steps:
    (a) connecting first connectors of a first type of connector to a first termination puck;
    (b) electrically connecting a main connector on the first termination puck to each first connectors within the plurality of first connectors;
    (c) connecting second connectors of a second type of connector to a second termination puck, the second type being different than the first type;
    (d) connecting a first main connector of the second termination puck to the main connector on the first termination puck; and,
    (e) selecting, for a control/status pin of a second main connector on the second termination puck, either a control/status pin from the first main connector or a control/status pin from one of the second connectors within the plurality of second connectors to be electrically connected to the control/status pin of the second main connector, the selecting being performed using a switch.

6. A method as in claim 5 wherein in step (a) the first type of connector is a DIN connector.

7. A method as in claim 5 wherein in step (c) the second type is a plurality of wire receptacles.

8. A method as in claim 5 wherein:
    in step (b) the main connector of the first termination puck is a 25 pin male D-sub connector;
    in step (d) the first main connector is a 25 pin female D-sub connector; and,
    in step (e), the second main connector is a 25 pin male D-sub connector.

* * * * *